(12) United States Patent
Naruse et al.

(10) Patent No.: US 7,514,794 B2
(45) Date of Patent: Apr. 7, 2009

(54) SEMICONDUCTOR INTEGRATED CIRCUIT AND THE METHOD OF DESIGNING THE LAYOUT

(75) Inventors: Tatsuya Naruse, Osaka (JP); Atsushi Yamamoto, Hyogo (JP)

(73) Assignee: Panasonic Corporation, Osaka (JP)

( * ) Notice: Subject to any disclaimer, the term of this patent is extended or adjusted under 35 U.S.C. 154(b) by 66 days.

(21) Appl. No.: 11/723,064

(22) Filed: Mar. 16, 2007

(65) Prior Publication Data

US 2008/0042284 A1 Feb. 21, 2008

(30) Foreign Application Priority Data

Mar. 17, 2006 (JP) .............................. 2006-073958

(51) Int. Cl.
*H01L 23/48* (2006.01)
(52) U.S. Cl. ................ 257/758; 257/691; 257/E23.011
(58) Field of Classification Search ................. 257/758, 257/691, E23.011
See application file for complete search history.

(56) References Cited

U.S. PATENT DOCUMENTS 6,734,472 B2 * 5/2004 Ho .............................. 257/207

2001/0011776 A1 8/2001 Igarashi et al.
2003/0079194 A1 4/2003 Igarashi et al.
2006/0017158 A1 1/2006 Takahata

FOREIGN PATENT DOCUMENTS

JP 2000-68383 3/2000

* cited by examiner

*Primary Examiner*—Victor A Mandala
(74) *Attorney, Agent, or Firm*—McDermott Will & Emery LLP

(57) ABSTRACT

The semiconductor integrated circuit of the present invention comprises: a standard cell group including a power supply wiring group or a ground wiring group, which is arranged at an interval based upon a design rule; a connection wiring that is provided in a same layer as the standard cell group for connecting between the power supply wirings or between the ground wirings; a strap wiring that crosses with the connection wiring three-dimensionally; and a connector body for interlayer-connecting the connection wiring and the strap wiring. The connector body has a shape different from that of the power supply wiring or the ground wiring.

7 Claims, 12 Drawing Sheets

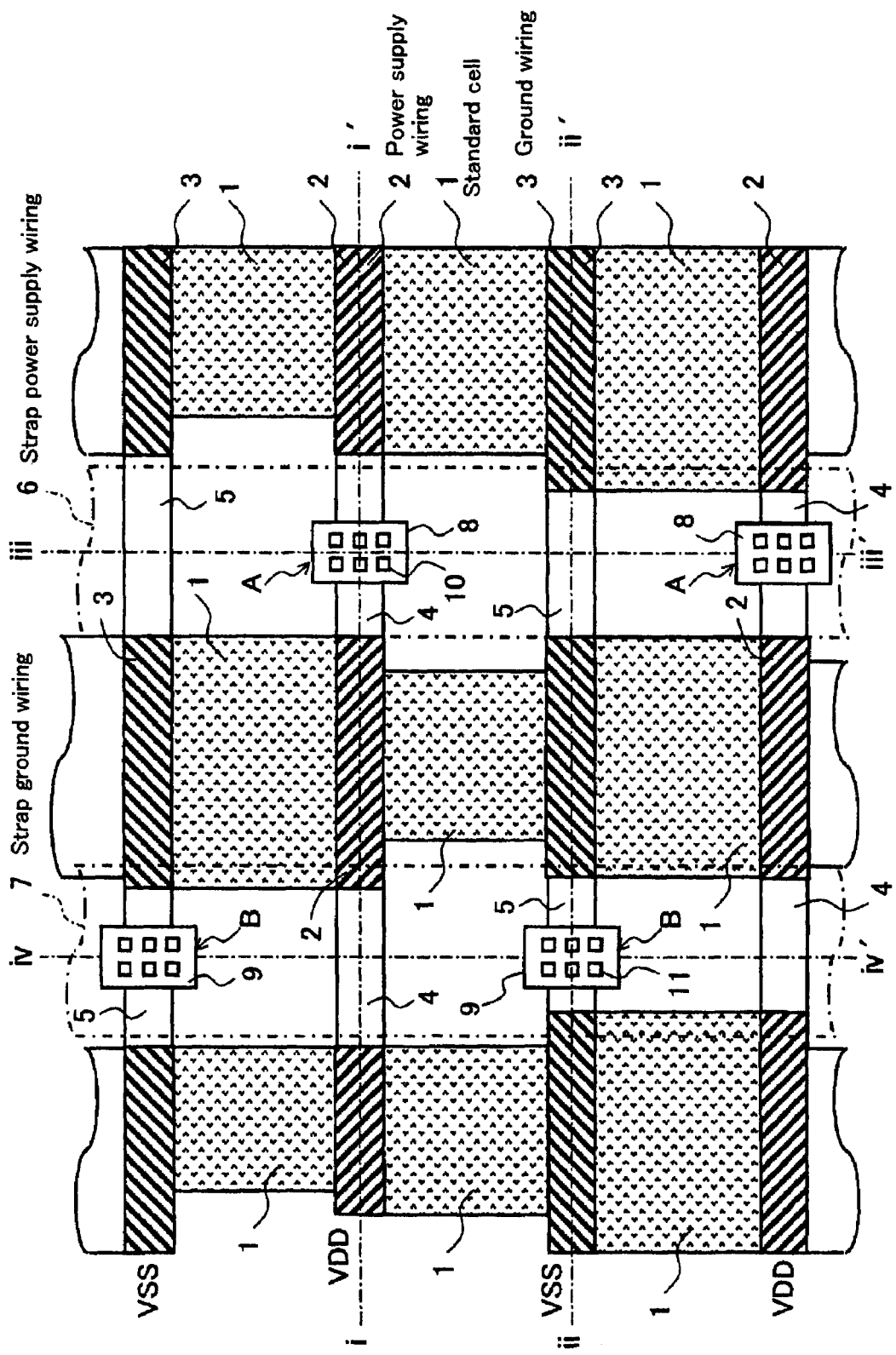

FIG. 4

S1
Input power supply filler cell and ground filler cell as libraries

S2
Form power supply connection wiring and ground connection wiring of first layer

S3
Form strap power supply wiring and strap ground wiring of fifth layer

S4
Insert power supply filler cell

S5
Insert ground filler cell

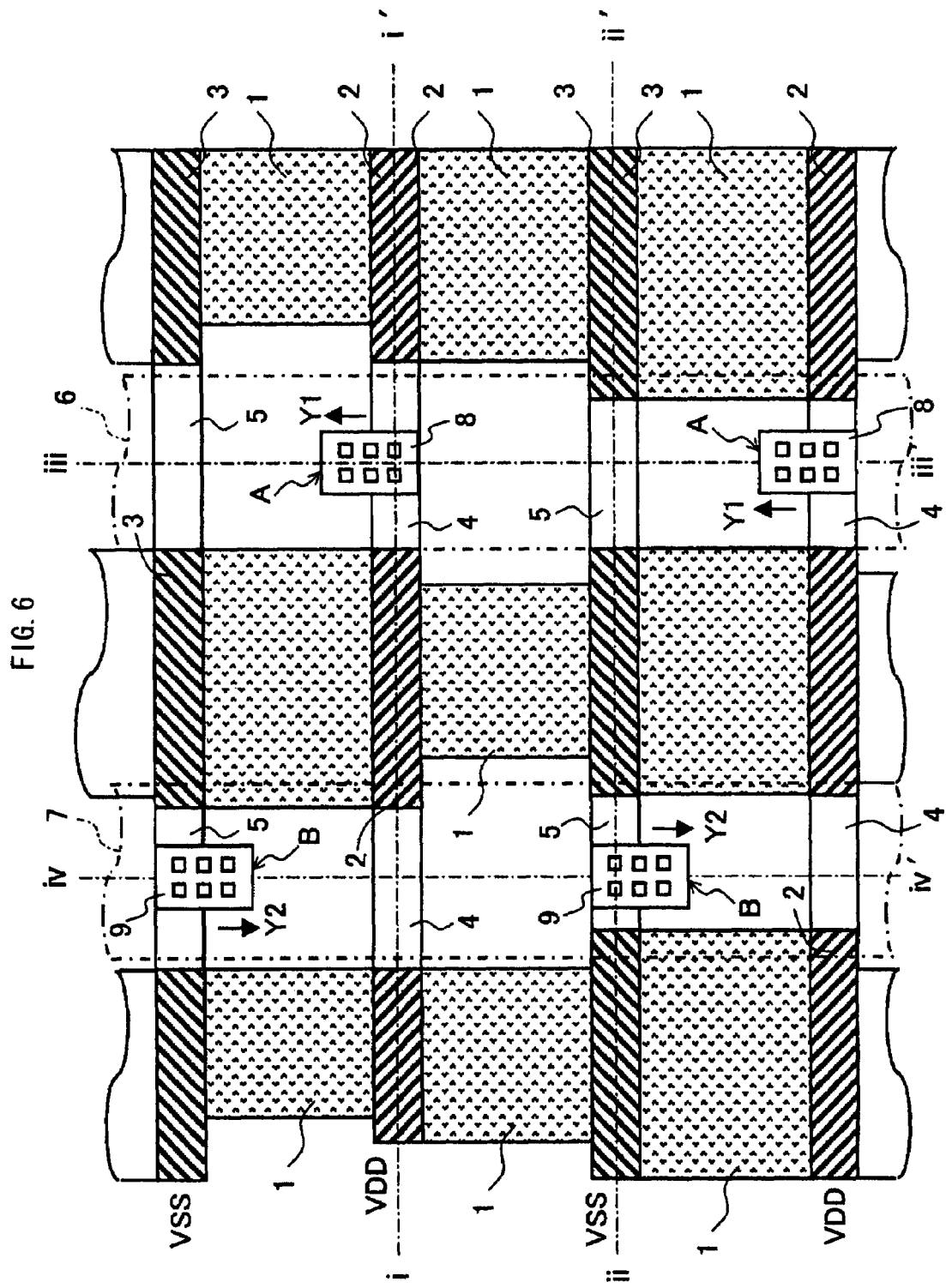

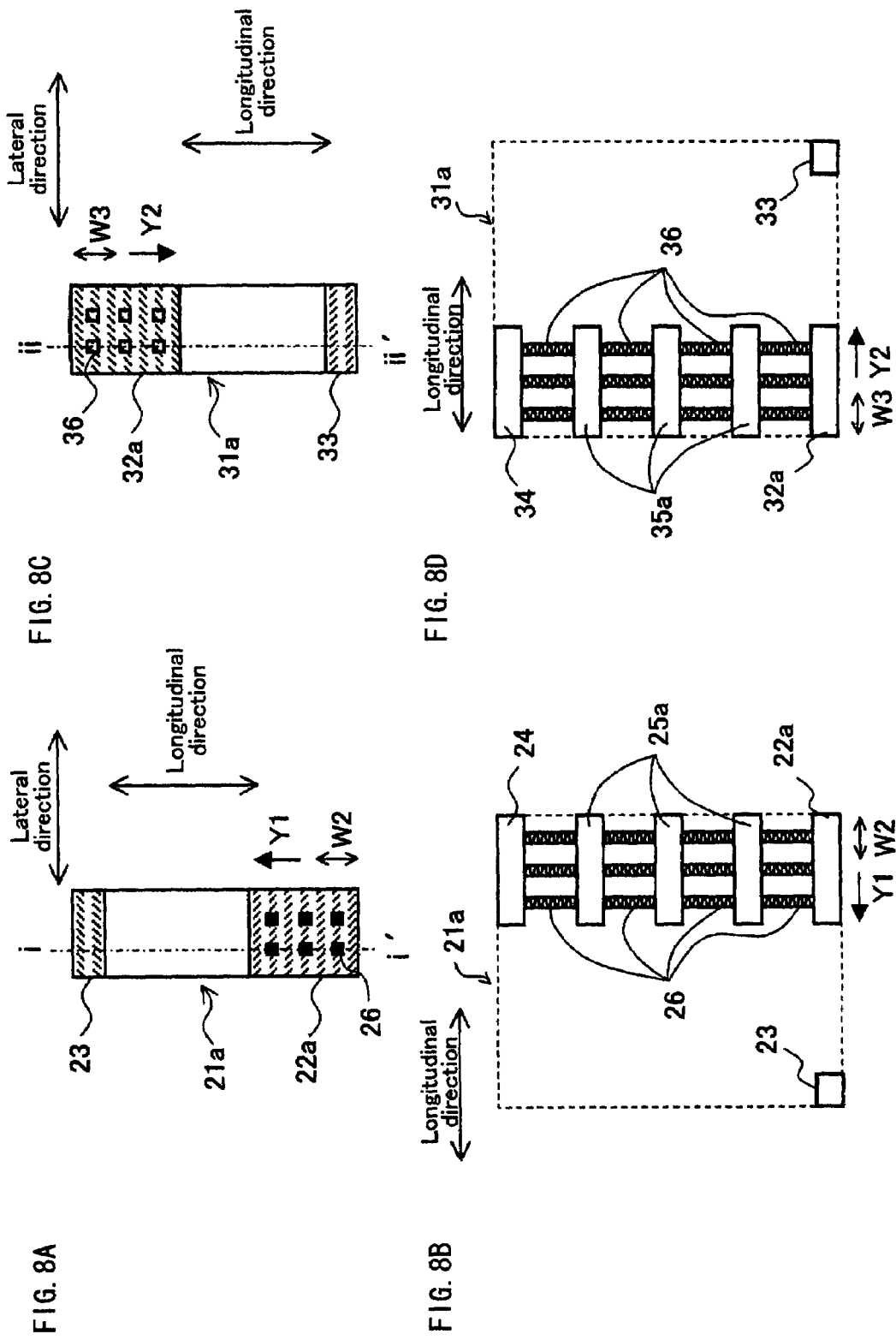

FIG. 9

S11
Input power supply filler cell and ground filler cell as libraries

S12
Form power supply connection wiring and ground connection wiring of first layer

S13
Form strap power supply wiring and strap ground wiring of fifth layer

S14
Designate every other row areas for inserting power supply filler cell and ground filler cell

S15
Insert power supply filler cell

S16
Insert ground filler cell

S17
Eliminate filler cell provided in area other than designated area

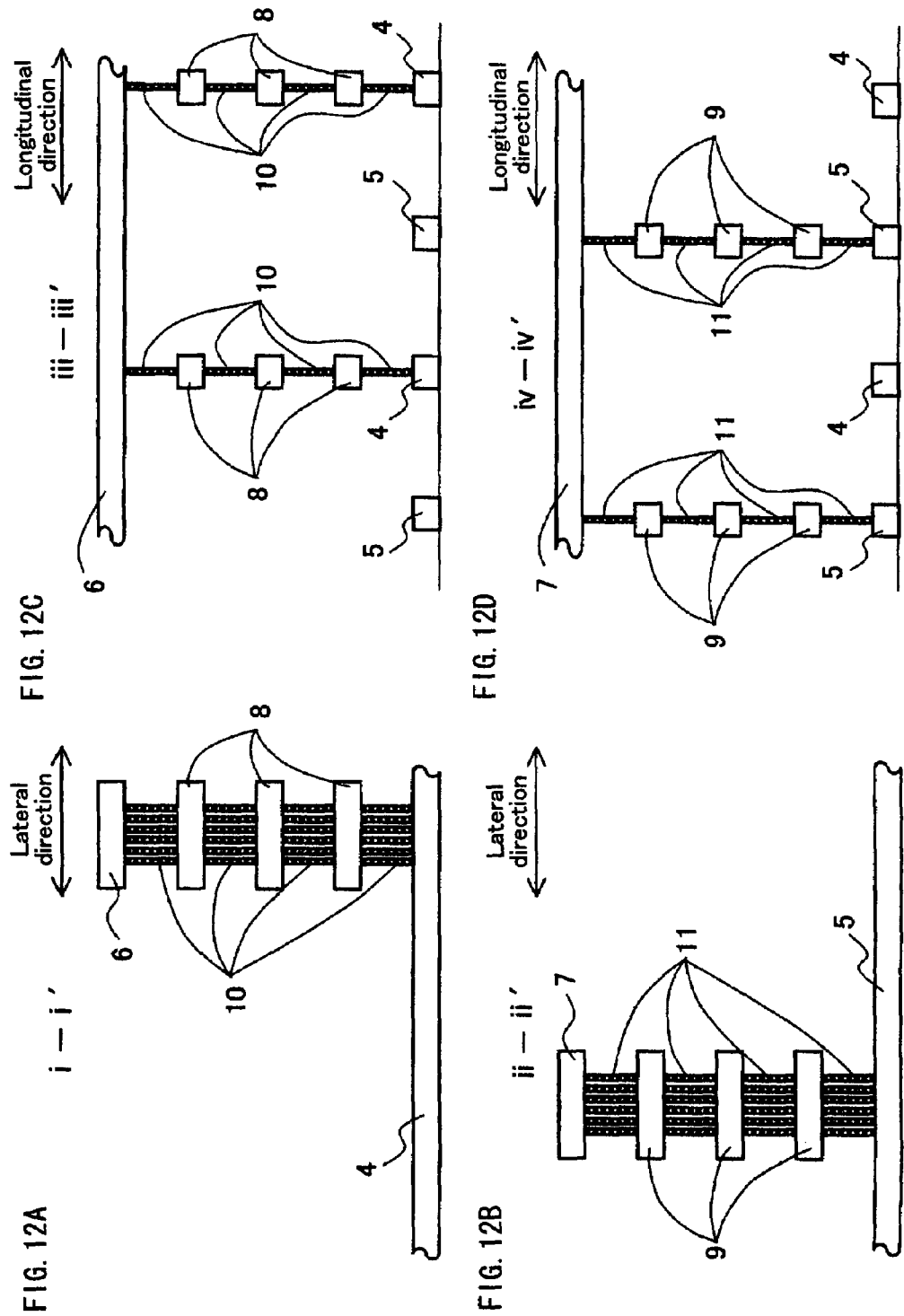

SEMICONDUCTOR INTEGRATED CIRCUIT AND THE METHOD OF DESIGNING THE LAYOUT

BACKGROUND OF THE INVENTION

1. Field of the Invention

The present invention relates to a structure of the semiconductor integrated circuit and a layout designing method of the same. More specifically, the present invention relates to a technique for avoiding wiring congestion in order to utilize a wiring area effectively without changing a floor plan or eliminating power supply vias or ground vias.

2. Description of the Related Art

Recently, semiconductor integrated circuits have been used in various fields, and therefore importance is attached to highly-integrated and small-area LSI for cutting the manufacturing cost. Under such circumstances, in designing the layout for determining the chip area of an LSI, generally, the layout of the standard cells are performed while increasing the packed ratio in order to achieve high integration and small size. However, the wiring density is increased in response to it, which causes wiring congestion. As a result, it comes to a limit in minimizing the chip area, at the point where the packed ratio reaches a high level of certain degree.

FIG. 11 and FIG. 12A-FIG. 12D illustrate the connection structure of the power supply wiring and the ground wiring in a conventional technique. FIG. 11 is a plan view, FIG. 12A is a sectional view taken along the line i-i' of FIG. 11, FIG. 12B is sectional view taken along the line ii-ii', FIG. 12C is a sectional view taken along the line iii-iii', and FIG. 12D is a sectional view taken along the line iv-iv'.

Standard cells 1 comprising a power supply wiring 2 and a ground wiring 3 inside thereof are arranged on a first layer. The standard cells 1 are arranged at the intervals without violating the design rule. The power supply wirings 2 of the neighboring standard cells 1 in the lateral direction are connected electrically to each other via a power supply connecting wiring 4, and the ground wirings 3 are connected electrically to each other via a ground connection wiring 5. In a fifth layer, a strap power supply wiring 6 and a strap ground wiring 7 are arranged so as to cross with the power supply connection wiring 4 and the ground connection wiring 5 at a right angle. In FIG. 11, the strap power supply wiring 6 and the strap ground wiring 7 are illustrated with dashed lines. Interlayer power supply wiring 8 corresponding to three layers are provided for electrically connecting the power supply wiring 4 of the first layer and the strap power supply wiring 6 of the fifth layer, which crosses the power supply wiring 4 three-dimensionally. Interlayer ground wirings 9 corresponding to three layers are provided for electrically connecting the ground wiring 5 of the first layer and the strap ground wiring 7 of the fifth layer, which crosses the ground wiring 5 three-dimensionally. The power supply connection wiring 4, the interlayer power supply wiring 8 and the strap power supply wiring 6 are electrically connected through a power supply via array 10. The ground connection wiring 5, the interlayer ground wiring 9 and the strap ground wiring 7 are electrically connected through a ground via array 11. In the conventional cases, when wiring congestion is generated in such structure, the wiring area is secured either by reducing the interlayer wiring and the via array in the necessary direction in the wiring area or by totally eliminating those in order to avoid the wiring congestion.

Further, as another method for avoiding the wiring congestion, a method is also proposed as disclosed in Japanese Published Patent Literature (Japanese Unexamined Patent Publication 2000-68383), which determines the number of necessary vias based on the maximum current density of the vias in order to adjust the number of vias.

In the conventional technique described above, the interlayer wirings and the via arrays are either reduced or eliminated completely in order to increase the wiring resource. That is, the interlayer wirings and the via arrays are reduced or eliminated completely in the lateral direction for increasing the longitudinal wiring resource, while those are reduced or eliminated completely in the longitudinal direction for increasing the lateral wiring resource.

However, when such reduction or elimination is carried out, the paths where the electric current flows are reduced, which causes an increase in the maximum current density in the periphery thereof. When it exceeds the defined maximum current capacity, a power supply electro-migration (EM) error is generated as a result. Further, the wiring resistance is increased, which may cause a drop in the voltage. The regulation of the maximum current capacity and the voltage drop becomes strict in the micro-process, so that the inconveniences described above become more prominent as the micronization advances in the future.

When the maximum current density is high in the area where the wiring congestion is generated, it is not constituted with a small number of vias in the layout designing method disclosed in Japanese Published Patent Literature described above. Thus, the wiring congestion cannot be avoided.

SUMMARY OF THE INVENTION

The object of the present invention therefore is to avoid the wiring congestion by achieving effective use of the wiring resource, without reducing the number of connection vias or without generating the power supply EM error and a drop in the voltage.

In order to overcome the aforementioned issues, a semiconductor integrated circuit according to the present invention comprises:

a standard cell group including a power supply wiring group or a ground wiring group, which is arranged at an interval based upon a design rule;

a connection wiring that is provided in a same layer as the standard cell group for connecting between the power supply wirings or between the ground wirings to each other;

a strap wiring that crosses with the connection wiring three-dimensionally; and a connector body for interlayer-connecting the connection wiring and the strap wiring, wherein the connector body has a shape different from that of the power supply wiring or the ground wiring.

Furthermore, it is preferable for the connector to comprise:
the connection wiring;

one or more layers of interlayer wirings; and a via array for interlayer-connecting the interlayer wirings to each other, and interlayer-connecting the interlayer wirings and the connection wiring.

In the present invention, the shape of the connector body (connection wiring, interlayer wiring, and the via array) is changed differently from the regular shape in accordance with the direction and dimension required for the arrangement of other wiring resources, without reducing the number of connection vias. This is called an odd-shaped connection structure. According to the odd-shaped power supply connection structure, the wiring area can be secured further in the direction that is required. As a result, the wiring resource can be utilized effectively, so that the wiring congestion can be avoided without generating power supply EM error or a drop in the voltage.

In the semiconductor integrated circuit of the above-described structure, there is such an embodiment that the connector body is localized on one side in the power supply wiring or the ground wiring.

When the connector bodies are provided on both sides in the power supply wiring or the ground wiring, flexibility of wirings in the lateral direction becomes more restricted to higher extent. On the contrary, when the connector body is distributed unevenly on only onside of the power supply wiring or the ground wiring, the connector bodies do not come to face each other in the neighboring row areas. Thus, flexibility of the wirings in the lateral direction can be more improved, so that it is possible to avoid the wiring congestion further.

A layout designing method of a semiconductor integrated circuit according to the present invention comprises the steps of:
  a step for providing a connection wiring for connecting between power supply wirings or between ground wirings included in the standard cell group in a same layer as that of a standard cell group which is arranged at an interval based upon a design rule;
  a step for providing a strap wiring that crosses with the connection wiring three-dimensionally; and
  a step for providing a connector body which interlayer-connects the connection wiring and the strap wiring, wherein
  in the step for providing the connector body, the connector body, that has a shape different from that of the power supply wiring or the ground wiring, is provided.

The connector body is constituted, for example, with a filler cell. The filler cell is a filler consisting of an integration of a plurality of structural elements which are collected together. Preferably, it is constituted by integrating the connection wiring, the interlayer wiring, and the via array.

By preparing various connector bodies having necessary size and array shapes through such manufacturing method of a semiconductor integrated circuit, it is possible to avoid the wiring congestion more easily, in addition to the effects obtained by the invention regarding the structure of the semiconductor integrated circuit according to the present invention. This can be achieved because the layout efficiency is improved compared to the case where the connection wiring, the interlayer wiring, and the via array are arranged individually, since the interlayer connection structure is integrated into the connector body (the connection wiring, the interlayer wiring, the via array) and inserted to the section that requires the interlayer connection.

Further, a layout designing method of a semiconductor integrated circuit according to the present invention comprises the steps of:
  a step for designing a layout of a connection wiring, which connects between power supply wirings or between ground wirings included in the standard cell group, in a same layer as that of a standard cell group which is arranged at an interval based upon a design rule;
  a step for designing the layout of a strap wiring that crosses with the connection wiring three-dimensionally;
  a step for specifying an interlayer-connection section of the connection wiring and the strap wiring, that is, a layout section of a connector body that has a different shape from that of the power supply wiring or the ground wiring, and interlayer-connects the connection wiring and the strap wiring; and
  a step for doing the layout of the connector body at the specified layout section.

Alternatively, a layout designing method of a semiconductor integrated circuit according to the present invention comprises the steps of;
  a step for doing the layout of a connection wiring, which connects between power supply wirings or between ground wirings of the standard cell group, in a same layer as that of a standard cell group which is arranged at an interval based upon a design rule;
  a step for doing the layout of a strap wiring that crosses with the connection wiring three-dimensionally;
  a step for doing the layout of a connector body which has a different shape from a shape of the power supply wiring or the ground wiring, and interlayer-connects the connection wiring and the strap wiring;
  a step for specifying a necessary section among a layout section of the connector body; and
  a step for eliminating the connector body that is arranged in the layout section other than the necessary section.

Through such layout designing method, the connector body (filler cell or the like) can be inserted only in the necessary section underneath the strap wiring, and the unnecessary connector body can be eliminated. As a result, the layout area of the standard cells, and flexibility of the wirings can be more increased. Thus, the wiring congestion can be avoided further.

According to the present invention, the shape of the connector body (connection wiring, interlayer wiring, and the via array) is changed from the regular shape in accordance with the direction and dimension required for the layout of other wiring resources so as to be formed into the odd-shaped power supply connection structure or ground connection structure. Herewith, the wiring resource can be utilized effectively without reducing the number of connection vias. Therefore, it is possible to reduce the chip area by avoiding the wiring congestion without generating the power supply EM error or a drop in the voltage.

The present invention is effective in order to avoid the wiring congestion and reduce the chip area in an LSI that has a structure where the power supply connection is carried out with a different width from that of the power supply wiring or the ground wiring included in the standard cell.

BRIEF DESCRIPTION OF THE DRAWINGS

Other objects of the present invention will become clear from the following description of the preferred embodiments and the appended claims. Those skilled in the art will appreciate that there are many other advantages of the present invention by embodying the present invention.

FIG. 1 is a plan view showing a connection structure of power supply wirings and ground wirings according to a first embodiment of the present invention;

FIG. 4 is a flowchart showing the procedure of a layout designing method using the filler cells according to the second embodiment of the present invention;

FIG. 6 is a plan view showing the connection structure of the power supply wirings and the ground wirings according to a third embodiment of the present invention;

FIG. 8A-FIG. 8D are plan views and sectional views showing the structures of the power supply wirings and the ground wirings of filer cells according to a fourth embodiment of the present invention;

FIG. 9 is a flowchart showing the procedure of a layout designing method using the filler cells according to the fourth embodiment of the present invention;

FIG. 12A-FIG. 12D sectional views showing the connection structure of the power supply wirings and the ground wirings according to the conventional technique.

DETAILED DESCRIPTION OF THE INVENTION

Figure 2A:
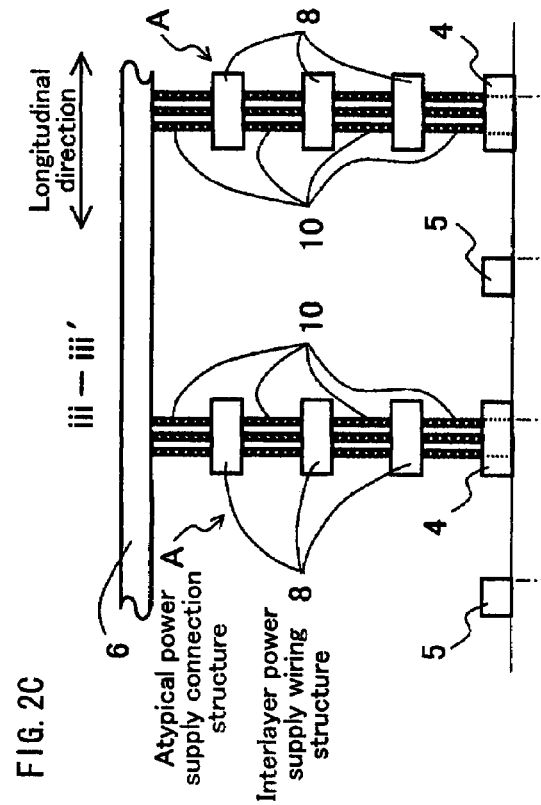
FIG. 2A-FIG. 2D are sectional views showing respectively the connection structure of power supply wirings and ground wirings according to the first embodiment of the present invention.

Hereinafter, embodiments of a semiconductor integrated circuit according to the present invention will be described in detail referring to the accompanying drawings.

First Embodiment

FIG. 1 and FIG. 2 show the structure of a semiconductor integrated circuit according to a first embodiment of the present invention. FIG. 1 is a plan view, FIG. 2A is a sectional view taken along the line i-i' of FIG. 1, FIG. 2B is sectional view taken along the line ii-ii', FIG. 2C is a sectional view taken along the line iii-iii', and FIG. 2D is a sectional view taken along the line iv-iv'. The "n-th layer" that appears in the following description indicates the wiring layer disposed in the n-th order among a group of wiring layers that are laminated in the semiconductor integrated circuit.

In FIG. 1 and FIG. 2A-FIG. 2D, reference numeral 1 is a standard cell. Reference numeral 2 is a power supply wiring provided inside the standard cell 1, and 3 is a ground wiring provided inside the standard cell 1. The power supply wiring 2 and the ground wiring 3 are provided on the first layer. A plurality of standard cells 1 is provided, and the plurality of standard cells 1 are arranged at an appropriate interval along the lateral direction (in one of the directions in a plane of the semiconductor integrated circuit, which is the right-to-left direction in the drawing). The group of standard cells 1 aligned along a lateral direction is also aligned side-by-side along a longitudinal direction (another direction that is orthogonal to the above-described direction in the plane of the semiconductor integrated circuit, which is the top-to-bottom direction in the drawing). In the group of the standard cells 1, the interval between the neighboring cells in the longitudinal and lateral directions are set arbitrarily.

Reference numeral 4 is a power supply connection wiring (one of the connection wirings), which electrically connects the power supply wirings 2 of the adjacent standard cells 1 in the lateral direction. The power supply connection wiring 4 is also provided in the first layer as in the case of the power supply wiring 2. Reference numeral 5 is a ground connection wiring (one of the connection wirings), which electrically connects the ground wirings 3 of the adjacent standard cells 1 in the lateral direction. The ground connection wiring 5 is also provided in the first layer as in the case of the ground wiring 3. The power supply connection wiring 4 and the ground connection wiring 5 are arranged in parallel to each other. Reference numeral 6 is a strap power supply wiring (one of the strap wirings), which is arranged so as to cross the power supply connection wiring 4 and the ground connection wiring 5 three-dimensionally at a right angle. Reference numeral 7 is a strap ground wiring (one of the strap wirings), which is arranged to cross the power supply connection wiring 4 and the ground connection wiring 5 three-dimensionally at a right angle. The strap power supply wiring 6 and the strap ground wiring 7 are provided on the fifth layer. In FIG. 1, the strap power supply wiring 6 and the strap ground wiring 7 are illustrated with dashed lines.

Reference numeral 8 is an interlayer power supply wiring (one of the interlayer wirings) for electrically connecting the power supply wiring 4 and the strap power supply wiring 6. Reference numeral 9 is an interlayer ground wiring (one of the interlayer wirings) for electrically connecting the ground wiring 5 and the strap ground wiring 7. In this embodiment, the interlayer power supply wiring 8 and the interlayer ground wiring 9 are disposed in the second layer, the third layer, and the fourth layer. Reference numeral 10 is a power supply via array (one of the via arrays) for electrically connecting the power supply connection wiring 4, the interlayer power supply wiring 8 and the strap power supply wiring 6. Reference numeral 11 is a ground via array (one of the via arrays) for electrically connecting the ground connection wiring 5, the interlayer ground wiring 9 and the strap ground wiring 7. The power supply connection wiring 4, the interlayer power supply wiring 8, the strap power supply wiring 6, and the power supply via array 10 constitutes a connector body. Similarly, the ground connection wiring 5, the interlayer ground wiring 9, the strap ground wiring 7 and the ground via array 11 constitutes a connector body.

Figure 11:
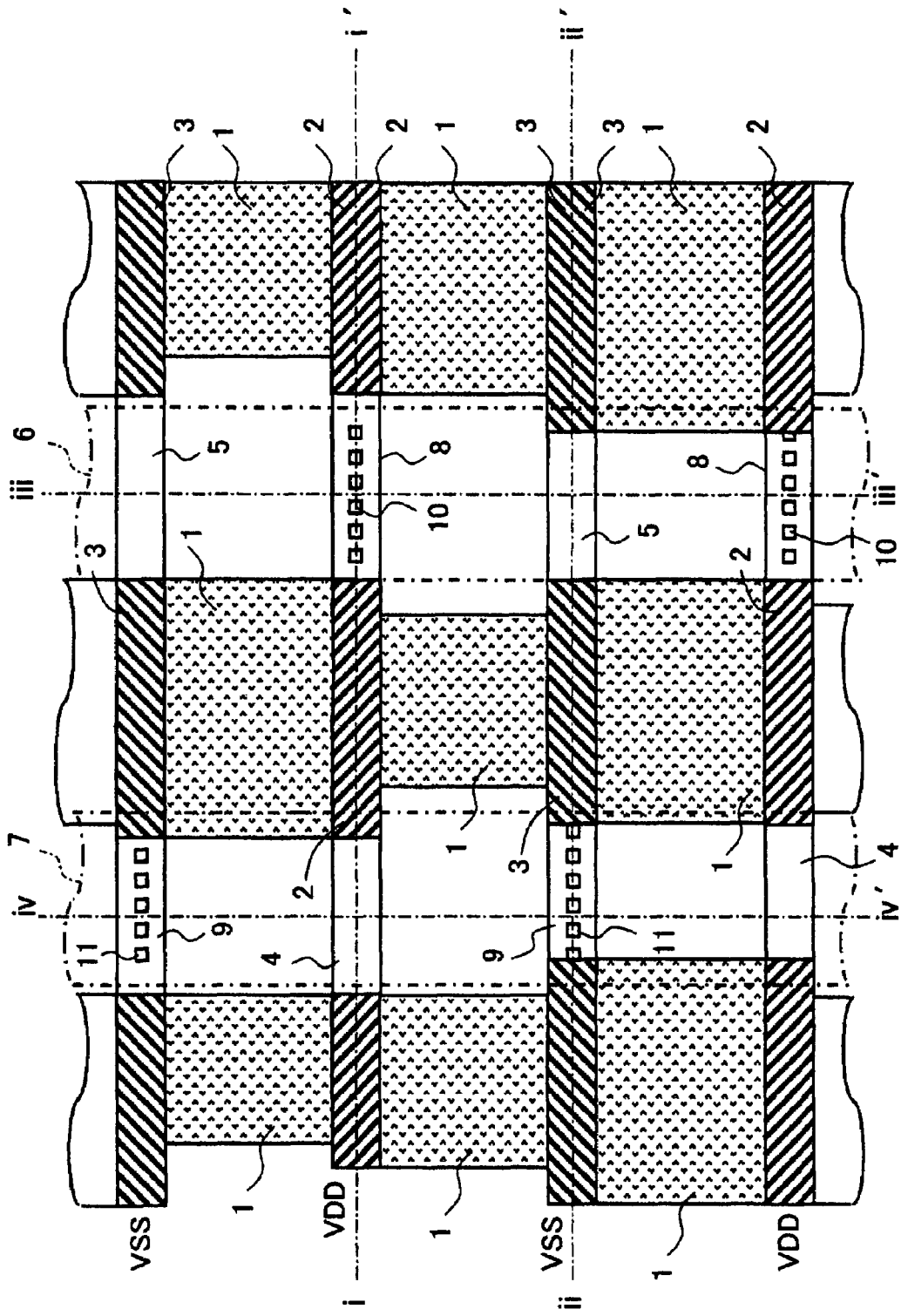
FIG. 11 is a plan view showing the connection structure of the power supply wirings and the ground wirings according to a conventional technique.

Now, the structure of FIG. 1, FIG. 2A-FIG. 2D is compared to the conventional structure of FIG. 11, 12. In the conventional case (FIG. 11, FIG. 12), the power supply via array 10 and the ground via array 11 are both in one row and six columns. Meanwhile, in the embodiment (FIG. 1, FIG. 2), the power supply via array 10 and the ground via array 11 are both in three rows and two columns. The number of connection vias in both cases is "6", however, the array form is different form each other.

That is, for the power supply wiring 4 and the interlayer power supply wiring 8, the part that is connected to the strap power supply wiring 6 through the power supply via array 10 has a different shape from those of other wirings. This is an odd-shaped power supply connection structure A. Further, for the ground wiring 5 and the interlayer ground wiring 9, the wiring part that is connected to the strap ground wiring 7 through the ground via array 11 has a different shape from those of other wirings. This is an odd-shaped ground connection structure B.

Figure 2B:
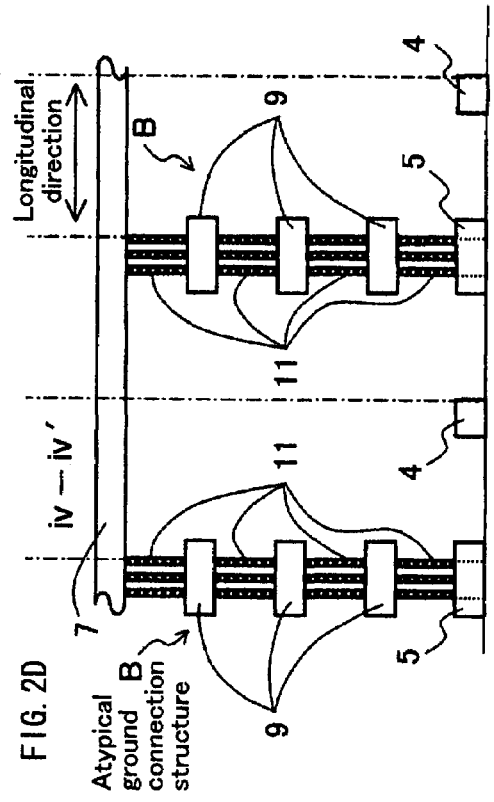
Figure 2C:
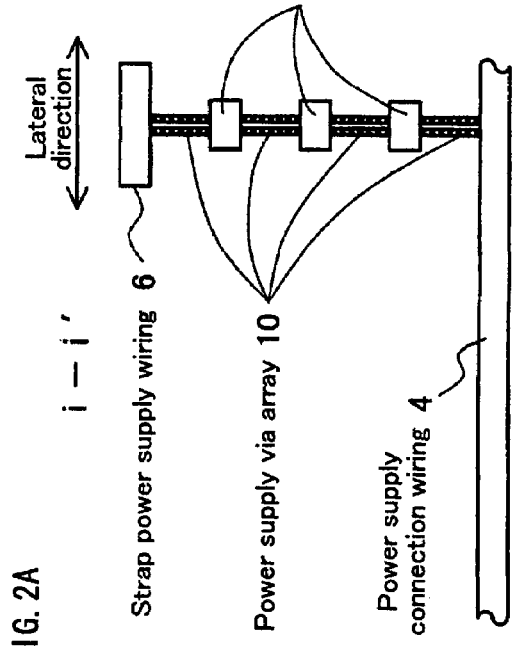
Figure 2D:
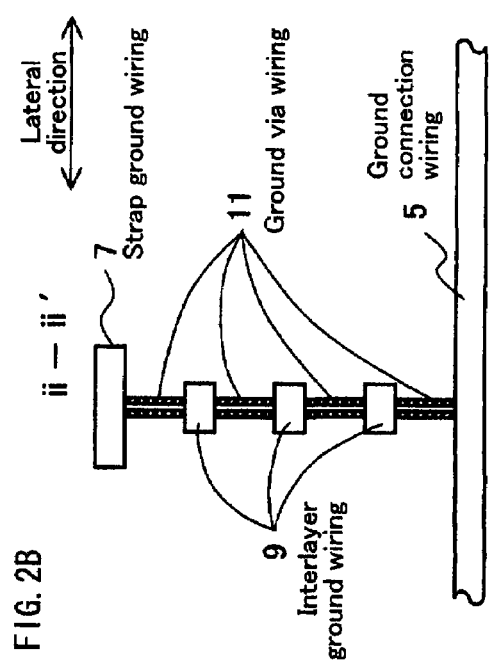

In the part shown in FIG. 2D with no interlayer power supply wiring 8 and no power supply via array 10, the width of the power supply connection wiring 4 in the longitudinal direction is the same as the width of the power supply wiring 2 in the standard cell 1. On the contrary, in the part shown in FIG. 2C with the interlayer power supply wiring 8 and the power supply via array 10, the width of the power supply connection wiring 4 and the interlayer power supply wiring 8 in the longitudinal direction is larger than the width of the power supply wiring 2 in the standard cell 1. That is, the width thereof is expanded in the longitudinal direction.

Furthermore, in the part shown in FIG. 2C with no interlayer ground wiring 9 and no ground via array 11, the width of the ground connection wiring 5 in the longitudinal direction is the same as the width of the ground wiring 3 in the standard cell 1. Correspondingly, in the part shown in FIG. 2D with the interlayer ground wiring 9 and the ground via array 11, the width of the ground connection wiring 5 and the interlayer ground wiring 9 in the longitudinal direction is larger than the width of the ground wiring 3 in the standard cell 1. That is, the width thereof is expanded in the longitudinal direction.

Further, as shown in FIG. 2A and FIG. 2B, the width of the interlayer power supply wiring 8 and the interlayer ground wiring 9 in the lateral direction is smaller compared to the case shown in FIG. 12A and FIG. 12B. That is, the width thereof is reduced in the lateral direction.

According to the embodiment, through providing the odd-shaped power supply connection structure A and ground connection structure B, it is possible to secure the wiring region in accordance with the direction and the dimension required for arranging other wiring resources, without changing the number of connection vias. As a result, the wiring resource can be utilized effectively, and the wiring congestion can be avoided without generating the power supply EM error or a drop in the voltage.

In the above-described structure, it is not necessary for the positions of the odd-shaped power supply connection structure A and ground connection structure B to coincide with the center of the upper-layer strap part in the lateral direction. It may be shifted either in the right direction or in the left direction.

Furthermore, in the above-described structure, mutual positional relationship of the connection wiring, the interlayer wiring and the via array part in the first layer, which are the individual structural elements of the odd-shaped power supply connection structure A and ground connection structure B, may be shifted from each other in the longitudinal direction or in the lateral direction.

Second Embodiment

A second embodiment of the present invention relates to a layout designing method of the semiconductor integrated circuit, which achieves the structure of the first embodiment by using a filler cell. A filler cell functions as a stuffing. In this embodiment, the filler cell corresponds to an integrated body of a plurality of structural elements, which constitutes a connector body.

Figure 3A:
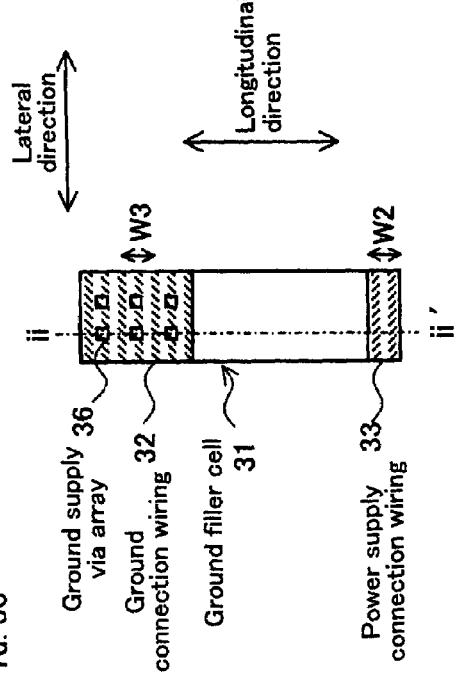
FIG. 3A-FIG. 3D are plan views and sectional views showing respectively the structures of the power supply wirings and the ground wirings of filer cells according to a second embodiment of the present invention.
Figure 3B:
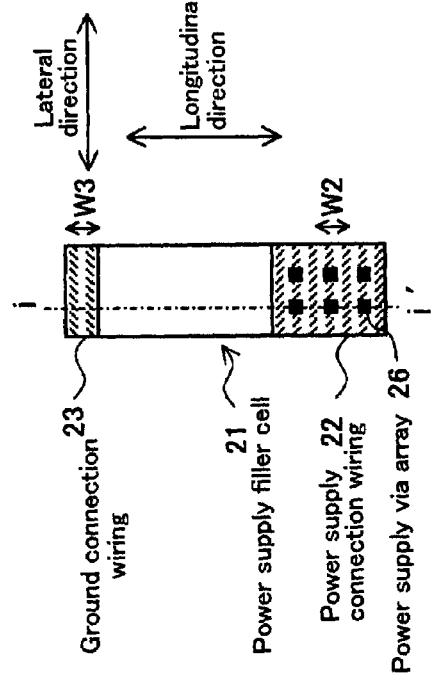
Figure 3C:
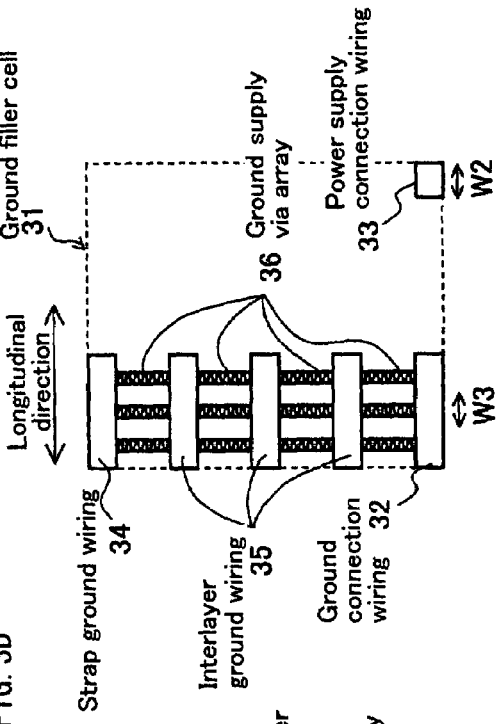
Figure 3D:
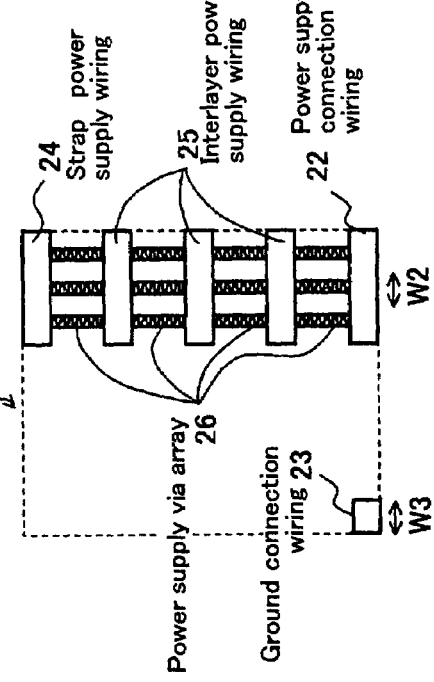

FIG. 3A is a plan view showing a power supply filler cell 21, and FIG. 3B is a sectional view taken along the line i-i' in FIG. 3A. FIG. 3C is a plan view showing a ground filler cell 31, and FIG. 3D is a sectional view taken along the line ii-ii' in FIG. 3C.

In FIG. 3A-FIG. 3D, reference numeral 21 is a power supply filler cell that functions as a stuffing. The power supply filler cell 21 comprises a power supply connection wiring 22, a ground connection wiring 23, a strap power supply wiring 24, an interlayer power supply wiring 25 and a power supply via array 26. The power supply connection wiring 22 is provided in the first layer. The power supply connection wiring 22 has a different width (wider) from that of the power supply wiring 2 of the standard cell 1 that is described in the first embodiment. The ground connection wiring 23 is provided in the first layer. The ground connection wiring 23 has the same width as that of the ground wiring 2 of the standard cell 1 that is described in the first embodiment. The strap power supply wiring 24 is provided in the fifth layer. The interlayer power supply wiring 25 electrically connects the power supply connection wiring 22 and the strap power supply wiring 24. The power supply via array 26 electrically connects the power supply connection wiring 22, the interlayer power supply wiring 25 and the strap power supply wiring 24. The power supply filler cell 21 is constituted through integrating a plurality of those structural elements.

Reference numeral 31 is a ground filler cell that functions as a stuffing. The ground filler cell 31 comprises a ground connection wiring 32, a power supply connection wiring 33, a strap ground wiring 34, an interlayer ground wiring 35 and a ground via array 36. The ground connection wiring 32 is provided in the first layer. The ground connection wiring 32 has a different width (wider) from that of the ground wiring 3 of the standard cell 1 that is described in the first embodiment. The power supply connection wiring 33 is provided in the first layer. The power supply connection wiring 33 has the same width as that of the power supply wiring 2 of the standard cell 1 that is described in the first embodiment. The strap ground wiring 34 is provided in the fifth layer. The interlayer ground wiring 35 electrically connects the ground connection wiring 32 and the strap ground wiring 34. The ground via array 36 electrically connects the ground connection wiring 32, the interlayer ground wiring 35 and the strap ground wiring 34. The ground filler cell 31 is constituted through integrating a plurality of those structural elements.

In the power supply filler cell 21, the center position of the power supply connection wiring 22 in the longitudinal direction coincides with the center position of a width range W2 of the power supply wiring 2 in the standard cell 1 that is described in the first embodiment. It is to make the power supply connection wiring 22 in the power supply filler cell 21 stick out uniformly on both sides of the power supply connection wiring 4 in the longitudinal direction.

Further, in the ground filler cell 31, the center position of the ground connection wiring 32 in the longitudinal direction coincides with the center position of a width range W3 of the ground wiring 3 in the standard cell 1. It is to make the ground connection wiring 32 in the ground filler cell 31 stick out uniformly on both sides of the ground connection wiring 5 in the longitudinal direction.

In FIG. 3A-FIG. 3D, it is the feature of this embodiment that: the widths of the power supply connection wiring 22 and the interlayer power supply wiring 25 of the power supply filler cell 21 in the lateral direction are widened, and the power supply via array 26 is arranged in three rows and two columns; and the widths of the ground connection wiring 32 and the interlayer ground wiring 35 of the ground filler cell 31 in the lateral direction are widened, and the ground via array 36 is arranged in three rows and two columns. Such feature of this embodiment corresponds to the feature of the first embodiment.

Figure 5:
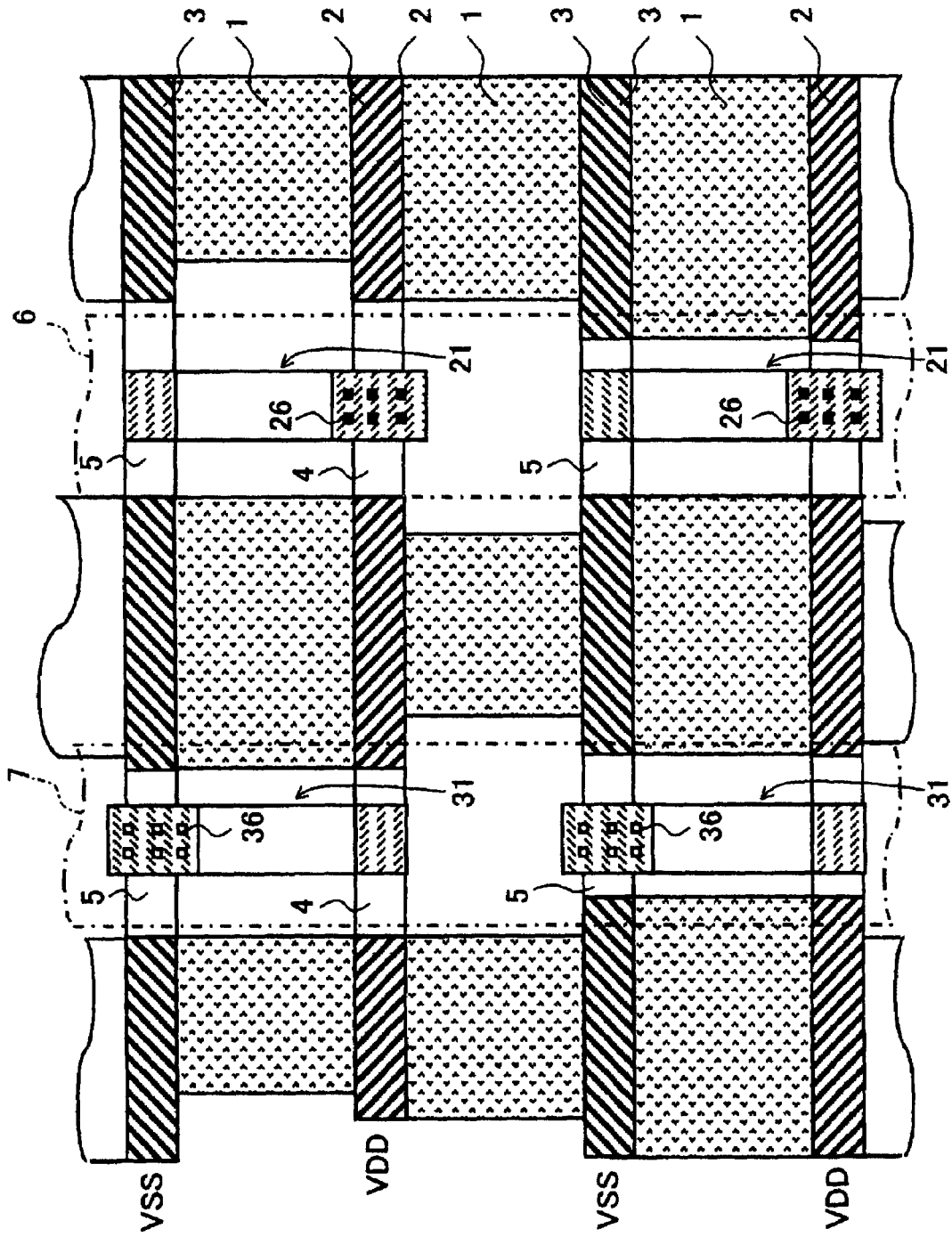
FIG. 5 is a plan view showing the connection structure of the power supply wirings and the ground wirings using the filler cells according to the second embodiment of the present invention.
Figure 7C:
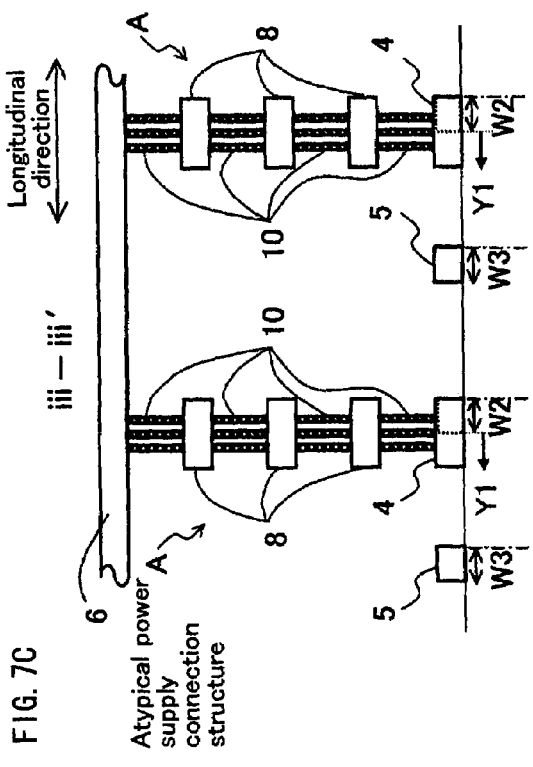
FIG. 7A-FIG. 7D are sectional views showing the connection structure of the power supply wirings and the ground wirings according to a third embodiment of the present invention.
Figure 7D:
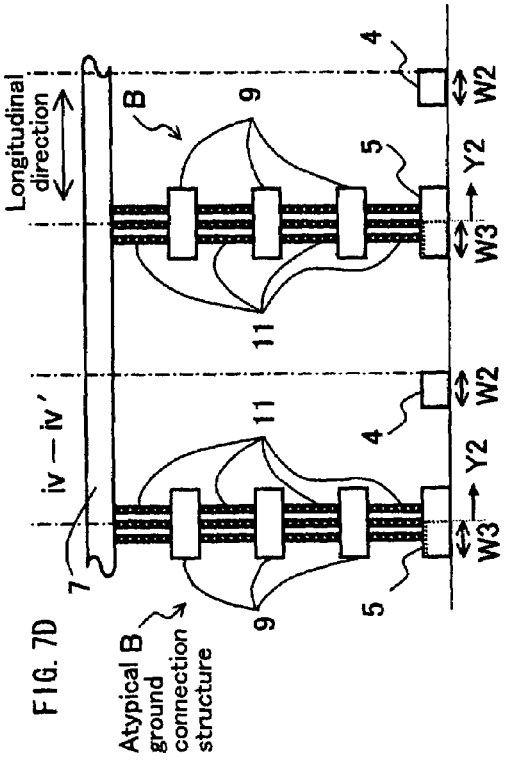
Figure 7A:
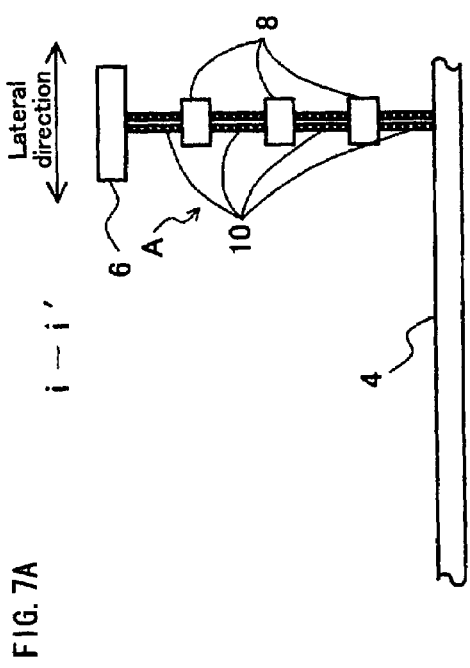
Figure 7B:
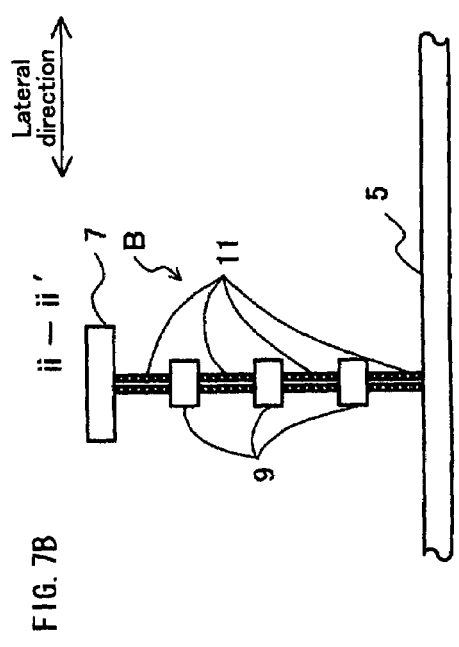

FIG. 4 is a flowchart describing the procedure of a layout designing method according to the second embodiment of the present invention. FIG. 5 illustrates the state after this layout designing method is carried out. In FIG. 5, the same reference numerals as those of the first embodiment shown in FIG. 1 indicate the same structural elements. The structure peculiar to this embodiment is that the power supply filler cell 21 and the ground filler cell 31 are used. Other structures are the same as those of the first embodiment, so that the descriptions thereof are omitted.

The procedure of the layout designing method of the semiconductor integrated circuit according to the embodiment will be described referring to FIG. 4 and FIG. 5. In step S1, the power supply filler cell 21 and the ground filler cell 31 are inputted as libraries. Then, in step S2, the power supply connection wiring 4 and the ground connection wiring 5 of the first layer are formed in the region where a group of the standard cells 1 is disposed. The power supply connection wiring 4 and the ground connection wiring 5 in the first layer are formed with the same width as those of the power supply wiring 2 and the ground wiring 3 provided inside the standard cell 1. Then, in step S3, the trap power supply wiring 6 and the trap ground wiring 7 of the fifth layer are formed. Then, in step S4, the power supply filler cell 21 is inserted. The power supply filler cell 21 connects the power supply connection wiring 4 and the strap power supply wiring 6 (three-dimensionally cross with the power supply connection wiring 4 at the upper position). Then, in step S5, the ground filler cell 31 is inserted. The ground filler cell 31 connects the ground connection wiring 5 and the strap ground wiring 7 (three-dimensionally cross with the ground connection wiring 5 at the upper position). Step S4 and step S5 may be reversed in terms of the order.

The layout designing method of this embodiment is peculiar in the respect that it uses the filler cells 21 and 31 having the power supply structure and the ground structure, which are formed while considering the resource distributions of the longitudinal wirings and the lateral wirings in advance. If it is performed to realize the connection from the strap wirings formed in step S3 to the connection wirings of the first layer formed in step S2 with the use of the layout designing method according to the embodiment, the same effects as those of the first embodiment can be achieved much more easily.

Furthermore, in the above-described structure, the arranged position of the filler cell may not have to coincide with the center of strap part in the upper layer. It may be shifted either in the right direction or in the left direction. Further, the mutual positional relationship of the connection wiring, the interlayer wiring and the via array part in the first layer inside the filler cell, i.e. each of the structural elements, may be shifted from each other in the longitudinal direction or in the lateral direction.

Third Embodiment

FIG. 6 and FIG. 7 show the structure of the semiconductor integrated circuit according to a third embodiment of the present invention. In FIG. 6 and FIG. 7, the same reference numerals as those of the first embodiment shown in FIG. 1 and FIG. 2 indicate the same structural elements. The structure peculiar to this embodiment is as follows. In the structure of the first embodiment described in FIG. 1 and FIG. 2, the odd-shaped power supply connection structure A projects uniformly on both sides of the power supply connection wiring 4 in the longitudinal direction. Further, the odd-shaped ground connection structure B projects uniformly on both side of the ground connection wiring 5 in the longitudinal direction.

On the contrary, in the structure of this embodiment shown in FIG. 6 and FIG. 7, the odd-shaped power supply connection structure A projects only on the upper side of the power supply connection wiring 4 in the longitudinal direction as indicated with an arrow Y1, and the odd-shaped ground connection structure B projects only on the lower side of the ground connection wiring 5 in the longitudinal direction as indicated with an arrow Y2. That is, the odd-shaped power supply connection structure A and the odd-shaped ground connection structure B are unevenly distributed on one side of the power supply wiring or the ground wiring.

In the row of the standard cells 1 lined in the lateral direction, the projecting direction Y1 of the odd-shaped power supply connection structure A and the projecting direction Y2 of the odd-shaped ground connection structure B are in the directions that face with each other. That is, the structure is in a state of approaching to each other. This relationship is realized every other row of the standard cells lined in the lateral direction. As a result, in the every other row indicated with a mark of ※ between the rows, there is no projection of the odd-shaped power supply connection structure A and the odd-shaped ground connection structure B. Therefore, it is possible to increase the flexibility of the wiring in the lateral direction. Thus, it is possible to further avoid the wiring congestion in addition to the effects obtained by the first embodiment. Other structures are the same as those of the first embodiment, so that the descriptions thereof are omitted.

Moreover, in the above-described structure, the projecting directions may be set so as to be estranged from each other, by setting the projecting direction of the odd-shaped power supply connection structure A to an inverse Y1 direction, and setting the projecting direction of the odd-shaped ground connection structure B to an inverse Y2 direction. Further, it is not necessary for the positions of the odd-shaped power supply connection structure A and ground connection structure B to consist with the center of the upper-layer strap part in the lateral direction. It may be shifted either in the right direction or in the left direction. Furthermore, mutual positional relationship of the connection wiring, the interlayer wiring and the via array part on the first layer, which are the individual structural elements of the odd-shaped power supply connection structure A and ground connection structure B, may be shifted from each other in the longitudinal direction or in the lateral direction.

Fourth Embodiment

A fourth embodiment of the present invention relates to the layout designing method of the semiconductor integrated circuit, which achieves the structure of the third embodiment by using a filler cell.

FIG. 8A is a plan view showing a power supply filler cell 21a, and FIG. 8B is a sectional view taken along the line i-i' in FIG. 8A. FIG. 8C is a plan view showing a ground filler cell 31a, and FIG. 8D is a sectional view taken along the line ii-ii' in FIG. 8C. In FIG. 8A-FIG. 8D, the same reference numerals as those of the second embodiment (structure of FIG. 3) indicate the same structural elements. The structure peculiar to this embodiment is as follows. The power supply filler cell 21a comprises, as indicated with an arrow Y1, a power supply connection wiring 22a and interlayer power supply wirings 25a, which project from the width range W2 of the power supply wiring 2 of the standard cell 1 towards the inner side (on the ground connection wiring 23 side) in the longitudinal direction. The ground filler cell 31a comprises, as indicated with an arrow Y2, a ground connection wiring 32a and interlayer ground wirings 35a, which project from the width range W3 of the ground wiring 3 of the standard cell 1 towards the inner side (on the power supply connection wiring 33 side) in the longitudinal direction. Other structures are the same as those of the second embodiment, so that the descriptions thereof are omitted.

Figure 10:
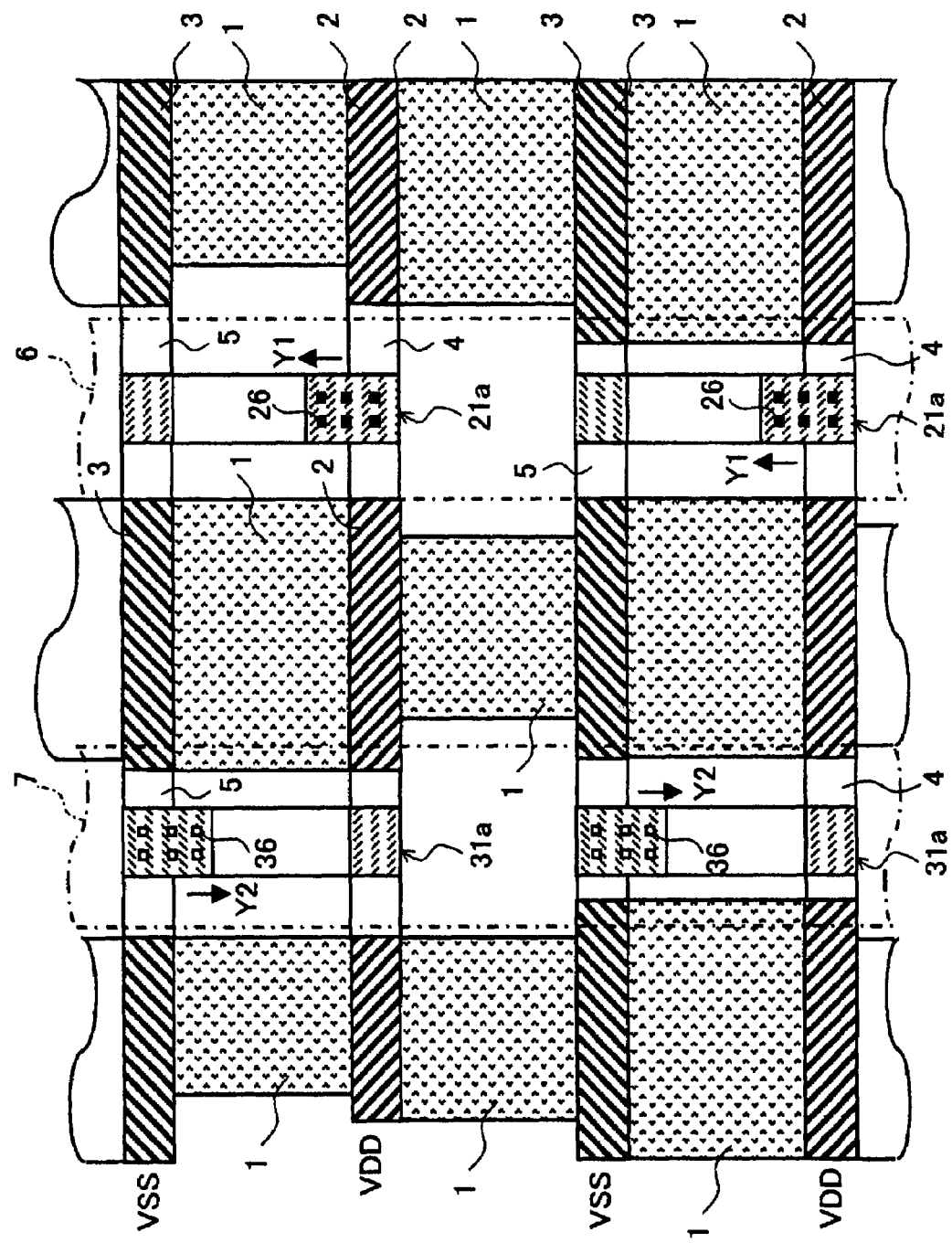
FIG. 10 is a plan view showing the connection structure of the power supply wirings and the ground wirings using the filler cells according to the fourth embodiment of the present invention.

FIG. 9 is a flowchart describing the procedure of a layout designing method according to the fourth embodiment of the present invention. FIG. 10 illustrates the state after the layout designing method is carried out. In FIG. 10, the same reference numerals as those of the second embodiment shown in FIG. 5 indicate the same structural elements. The structure peculiar to this embodiment is that the power supply filler cell 21a and the ground filler cell 31a are provided. Other structures are the same as those of the second embodiment, so that the descriptions thereof are omitted.

In step S11, the power supply filler cell 21a and the ground filler cell 31a are inputted as libraries. Then, in step S12, the power supply connection wiring 4 and the ground connection wiring 5 of the first layer are formed in the region where a group of the standard cells 1 is disposed. The power supply connection wiring 4 and the ground connection wiring 5 of the first layer are formed with the same width as those of the power supply wiring 2 and the ground wiring 3. Then, in step S13, the strap power supply wiring 6 and the strap ground wiring 7 of the fifth layer are formed. Then, in step S14, row regions for setting every other row in inserting the power supply filler cell 21a and the ground filler cell 31a are designated. In this case, the power supply connection wiring 22a and the ground connection wiring 32a are arranged so that the projected connection part of the power supply connection wiring 22a and the projected connection part of the ground connection wiring 32a project towards the inner side (towards the ground connection wiring 23 side or the power supply connection wiring 33 side) of the designated row area. That is, as indicated with the arrows Y1 and Y2, the ground connection wiring 23 and the ground connection wiring 32a are arranged so as to face with each other, and the power supply connection wiring 33 and the power supply connection wiring 22a are arranged so as to face with each other.

Then, in step S15, the power supply filler cell 21a is inserted. The power supply filler cell 21a connects the power supply connection wiring 4 and the strap power supply wiring 6 (three-dimensionally cross with the power supply connection wiring 4 at the upper position). Then, in step S16, the ground filler cell 31a is inserted. The ground filler cell 31a connects the ground connection wiring 5 and the strap ground wiring 7 (three-dimensionally cross with the ground connection wiring 5 at the upper position). Subsequently, in step S17, the filler cells 21a and 31a in the region other than the row region designated in step S14 are eliminated. Step S15 and step S16 may be reversed in terms of the order.

According to this layout designing method, filler cells can be provided only in the necessary part underneath the strap wiring. Thus, the filler cells that have been considered unnecessary can be eliminated. Therefore, in addition to the effects obtained by the second embodiment, it is possible to increase the region for arranging the standard cells further. Further, it is possible to increase the flexibility of the wirings in the lateral direction. Therefore, the wiring congestion can be further avoided.

In the above-described structure, the projecting directions inside the filler cells may be inversed in the upper direction and the lower direction. The arranged position of the filler cells 21a and 31a may not have to coincide with the center of the upper-layer strap part. It may be shifted either in the right direction or in the left direction.

Further, in the above-described structure, the mutual positional relationship of the connection wiring, the interlayer wiring and the via array part on the first layer provided inside the filler cell, i.e. each of the structural elements, may be shifted from each other in the longitudinal direction or in the lateral direction.

Furthermore, in the above-described structure, the same effects can be also achieved in following modifications comprising a step of inputting filler cells which have the same number of vias and individually different shapes of connection wirings, interlayer wirings and via arrays in the first layer as a plurality of kinds of libraries in step S11; a step of automatically recognizing the part that requires the filler cell, and which filler cell should be inserted to the recognized part for achieving the optimum longitudinal and lateral resource distribution in step S14; and a step of inserting the optimum filler cell recognized in step S14 into the necessary part that is also recognized in step S14, in the next step thereof.

In all of the above described embodiments, any of the wiring layers can be used for each of the structures. Further, the effects can be also achieved with the only application of either the power supply wirings or the ground wirings. Furthermore, the direction different from that of the wiring in a first layer included inside the standard cell can also be achieved in any direction of the width or the height.

The present invention has been described in detail referring to the most preferred embodiments. However, various combinations and modifications of the components are possible without departing from the spirit and the broad scope of the appended claims.

What is claimed is:

1. A semiconductor integrated circuit, comprising:
  a standard cell group including a power supply wiring group or a ground wiring group, which is arranged at an interval based upon a design rule;
  a first connection wiring that is provided in a same layer as said standard cell group for connecting mutually between said power supply wirings or between said ground wirings;
  a second connection wiring that crosses with said first connection wiring three-dimensionally and is disposed over said first connection wiring, whose width is larger than that of said first connection wiring; and
  a connector body for interlayer-connecting said first connection wiring and said second connection wiring, wherein
  said connector body comprises a via array which includes a plurality of via regions and at least one of the via regions is located outside the first connection wiring when viewed from the top.

2. The semiconductor integrated circuit according to claim 1, wherein said connector body comprises:
  said first connection wiring;
  one or more layers of interlayer wirings; and
  the via array for interlayer-connecting said interlayer wirings mutually, and interlayer-connecting said interlayer wirings and said connection wiring.

3. The semiconductor integrated circuit according to claim 1, wherein said connector body is unevenly distributed on one side of said power supply wiring or on one side of said ground wiring.

4. A manufacturing method of a semiconductor integrated circuit, comprising the steps of:
  a step for providing a first connection wiring for connecting mutually between power supply wirings or between ground wirings of a standard cell group in a same layer as that of the standard cell group which is arranged at an interval based upon a design rule;
  a step for providing a second connection wiring that crosses with said first connection wiring three-dimensionally; and
  a step for providing a connector body which interlayer-connects said first connection wiring and said second connection wiring, wherein
  said connector body comprises a via array which includes a plurality of via regions and at least one of the via regions is located outside the first connection wiring when viewed from the top.

5. The manufacturing method of a semiconductor integrated circuit according to claim 4, wherein the following are provided as said connector body:
one or more layers of interlayer wirings; and
the via array for interlayer-connecting said interlayer wirings mutually, and interlayer-connecting said interlayer wirings and said first connection wiring.

6. A layout designing method of a semiconductor integrated circuit, comprising the steps of:
a step for doing the layout of a first connection wiring, which connects mutually between power supply wirings or between ground wirings of a standard cell group, in a same layer as that of the standard cell group which is arranged at an interval based upon a design rule;
a step for doing the layout of a second connection wiring that crosses with said first connection wiring three-dimensionally;
a step for specifying an interlayer-connection place of said first connection wiring and said second connection wiring, that is a layout place of a connector body that comprises a via array which includes a plurality of via regions and at least one of the via regions is located outside the first connection wiring when viewed from the top; and
a step for doing the layout of said connector body at said specified layout place.

7. A layout designing method of a semiconductor integrated circuit, comprising the steps of:
a step doing the layout of a first connection wiring, which connects mutually between power supply wirings or between ground wirings of a standard cell group, in a same layer as that of the standard cell group which is arranged at an interval based upon a design rule;
a step for doing the layout of a second connection wiring that crosses with said first connection wiring three-dimensionally;
a step for doing the layout of a connector body that comprises a via array which includes a plurality of via regions and at least one of the via regions is located outside the first connection wiring when viewed from the top;
a step for specifying a necessary place among a layout places of said connector body; and
a step for eliminating said connector body that is arranged in said layout places other than said necessary place.

* * * * *